United States Patent
Yu

(10) Patent No.: US 12,027,114 B2
(45) Date of Patent: Jul. 2, 2024

(54) PIXEL DRIVING CIRCUIT, METHOD FOR DRIVING THE SAME AND DISPLAY DEVICE

(71) Applicant: BOE Technology Group Co., Ltd., Beijing (CN)

(72) Inventor: Yang Yu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/763,364

(22) PCT Filed: Apr. 15, 2021

(86) PCT No.: PCT/CN2021/087380
§ 371 (c)(1),
(2) Date: Mar. 24, 2022

(87) PCT Pub. No.: WO2021/238479
PCT Pub. Date: Dec. 2, 2021

(65) Prior Publication Data
US 2022/0343842 A1    Oct. 27, 2022

(30) Foreign Application Priority Data
May 26, 2020 (CN) .......................... 202010455157.9

(51) Int. Cl.
*G09G 3/32* (2016.01)
*G09G 3/3225* (2016.01)
(Continued)

(52) U.S. Cl.
CPC ........... *G09G 3/3225* (2013.01); *G11C 19/28* (2013.01); *G09G 2300/0408* (2013.01);
(Continued)

(58) Field of Classification Search
CPC .......... G09G 3/3225; G09G 2300/0408–0426; G09G 2300/0842;
(Continued)

(56) References Cited

U.S. PATENT DOCUMENTS 10,004,124 B1 * 6/2018 Ko ...................... G09G 3/3233
10,964,264 B1 * 3/2021 Kim .................... G09G 3/3233
(Continued)

FOREIGN PATENT DOCUMENTS

| CN | 104575398 A | 4/2015 |
| CN | 104821150 A | 8/2015 |

(Continued)

OTHER PUBLICATIONS

CN 202010455157.9 first office action.
PCT/CN2021/087380 international search report and written opinion.

*Primary Examiner* — Lin Li
(74) *Attorney, Agent, or Firm* — IPro, PLLC

(57) ABSTRACT

The present disclosure provides a pixel driving circuit, a driving method thereof, and a display device. In the pixel driving circuit, a first terminal of a first storage sub-circuit is connected to a control terminal; a power control sub-circuit is connected to a light-emitting control signal line, a first power line and a first terminal of the driving sub-circuit; a compensation sub-circuit is connected to a first gate line, a control terminal and a first terminal of the driving sub-circuit; a data writing-in sub-circuit is connected to a second terminal of the first storage sub-circuit; a first reset sub-circuit is connected to a reset signal line, a first power line and the control terminal of the driving sub-circuit; a first control sub-circuit is connected to the first gate line, an initialization signal line and the second terminal of the driving sub-circuit.

9 Claims, 12 Drawing Sheets

(51) Int. Cl.
  *G09G 3/36* (2006.01)
  *G11C 19/28* (2006.01)
(52) U.S. Cl.
  CPC ............... *G09G 2300/0426* (2013.01); *G09G 2300/0819* (2013.01); *G09G 2300/0842* (2013.01); *G09G 2310/0286* (2013.01); *G09G 2310/0297* (2013.01); *G09G 2310/061* (2013.01); *G09G 2310/08* (2013.01); *G09G 2320/0233* (2013.01); *G09G 2330/021* (2013.01)
(58) Field of Classification Search
  CPC ................. G09G 2310/0286–0297; G09G 2310/061–08; G09G 2320/0233; G09G 2330/021; G11C 19/28
  See application file for complete search history.

(56) References Cited

U.S. PATENT DOCUMENTS

| | | | | |
|---|---|---|---|---|
| 2012/0050234 | A1* | 3/2012 | Jang | G09G 3/3225 345/204 |
| 2015/0029083 | A1* | 1/2015 | He | G09G 3/3648 345/100 |
| 2016/0232836 | A1 | 8/2016 | Yang et al. | |
| 2017/0018224 | A1* | 1/2017 | Lee | G09G 3/3291 |
| 2017/0116925 | A1* | 4/2017 | Lee | G09G 3/3275 |
| 2017/0249903 | A1* | 8/2017 | Xiang | G09G 3/3258 |
| 2018/0130412 | A1 | 5/2018 | Zhang et al. | |
| 2018/0151115 | A1* | 5/2018 | Tseng | G09G 3/3233 |
| 2018/0315374 | A1* | 11/2018 | Zhang | G09G 3/3208 |
| 2019/0043426 | A1 | 2/2019 | Zhang | |
| 2019/0156750 | A1 | 5/2019 | Dong | |
| 2019/0164490 | A1* | 5/2019 | Cheng | G09G 3/3258 |
| 2019/0180674 | A1* | 6/2019 | Han | G09G 3/3233 |
| 2019/0180834 | A1* | 6/2019 | Yuan | G09G 3/3258 |
| 2019/0279565 | A1* | 9/2019 | Yang | G09G 3/3266 |
| 2019/0325845 | A1* | 10/2019 | Zhu | G09G 3/2074 |
| 2020/0105205 | A1* | 4/2020 | Woo | G09G 3/3258 |
| 2021/0005143 | A1* | 1/2021 | Xuan | G09G 3/3233 |
| 2022/0199657 | A1* | 6/2022 | Ito | H01L 27/1225 |
| 2022/0366834 | A1* | 11/2022 | Xia | G09G 3/32 |

FOREIGN PATENT DOCUMENTS

| | | |
|---|---|---|
| CN | 205920745 U | 2/2017 |
| CN | 106652904 A | 5/2017 |
| CN | 108630141 A | 10/2018 |
| CN | 109493790 A | 3/2019 |
| CN | 109584785 A | 4/2019 |
| CN | 110176215 A | 8/2019 |
| CN | 110675822 A | 1/2020 |
| CN | 110890056 A | 3/2020 |
| CN | 111477178 A | 7/2020 |
| KR | 20190002938 A | 1/2019 |

\* cited by examiner

PIXEL DRIVING CIRCUIT, METHOD FOR DRIVING THE SAME AND DISPLAY DEVICE

CROSS-REFERENCE TO RELATED APPLICATION

This application is the U.S. national phase of PCT Application No. PCT/CN2021/087380 filed on Apr. 15, 2021, which claims priorities of the Chinese patent application No. 202010455157.9 filed on May 26, 2020, which is incorporated herein by reference in its entity.

TECHNICAL FIELD

The present disclosure relates to the field of display technology, and more particularly to a pixel driving circuit, a method for driving the same and a display device.

BACKGROUND

Active-matrix Organic Light-Emitting Diode (AMOLED) display device has many advantages such as self-luminous, ultra-thin, fast response, high contrast, wide viewing angle, etc., and has received widespread attention.

The AMOLED display device includes a plurality of pixel driving circuits and a plurality of light-emitting elements, and the pixel driving circuits are used to drive the corresponding light-emitting elements to emit light, thereby realizing the display function of the AMOLED display device. However, the existing pixel driving circuit has complex control signals, and the display device has the problem of the poor display brightness uniformity due to the threshold voltage shift of the driving transistor in the pixel driving circuit.

SUMMARY

The objective of the present disclosure is to provide a pixel driving circuit and a method for driving the same and a display device.

A first aspect of the present disclosure provides 1. A pixel driving circuit for driving a light-emitting element, includes: a driving sub-circuit, wherein the driving sub-circuit is used to control to connect or disconnect a first terminal of the driving sub-circuit and a second terminal of the driving sub-circuit under the control of a control terminal of the driving sub-circuit, the second terminal of the driving sub-circuit is connected to the light-emitting element; a first storage sub-circuit, wherein a first terminal of the first storage sub-circuit is connected to the control terminal of the driving sub-circuit; a power control sub-circuit, respectively connected to a light-emitting control signal line, a first power line and the first terminal of the driving sub-circuit, and configured to control to connect or disconnect the first power line and the first terminal of the driving sub-circuit under the control of the light-emitting control signal line; a compensation sub-circuit, respectively connected to a first gate line, the control terminal of the driving sub-circuit and the first terminal of the driving sub-circuit, and configured to control to connect or disconnect the control terminal of the driving sub-circuit and the first terminal of the driving sub-circuit; a data writing-in sub-circuit, respectively connected to a second gate line, a data line and a second terminal of the first storage sub-circuit, and configured to control to connect or disconnect the data line and the second terminal of the first storage sub-circuit under the control of the second gate line; a first reset sub-circuit, respectively connected to a reset signal line, the first power line and the control terminal of the driving sub-circuit, and configured to control to connect or disconnect the first power line and the control terminal of the driving sub-circuit under the control of the reset signal line; a first control sub-circuit, respectively connected to the first gate line, an initialization signal line and the second terminal of the driving sub-circuit, and configured to control to connect or disconnect the initialization signal line and the second terminal of the driving sub-circuit under the control of the first gate line.

Optionally, the pixel driving circuit further comprises a light-emitting control sub-circuit, and the second terminal of the driving sub-circuit is connected to the light-emitting element through the light-emitting control sub-circuit, the light-emitting control sub-circuit is respectively connected to the light-emitting control signal line, the second terminal of the driving sub-circuit and the light-emitting element, and configured to control to connect or disconnect the second terminal of the driving sub-circuit and the light-emitting element under the control of the light-emitting control signal line.

Optionally, the pixel driving circuit further includes: a second storage sub-circuit, a first terminal of the second storage sub-circuit is connected to the control terminal of the driving sub-circuit, and a second terminal of the second storage sub-circuit is connected to the light-emitting element.

Optionally, the light-emitting control sub-circuit includes: a sixth transistor, a gate electrode of the sixth transistor is connected to the light-emitting control signal line, and a first electrode of the sixth transistor is connected to the second terminal of the driving sub-circuit, and a second electrode of the sixth transistor is connected to the light-emitting element.

Optionally, the pixel driving circuit further includes: a second reset sub-circuit, the second reset sub-circuit is respectively connected to the reset signal line, the initialization signal line and the light-emitting element, and is configured to control to connect or disconnect the initialization signal line and the light-emitting element under the control of the reset signal line.

Optionally, the second reset sub-circuit includes a seventh transistor, a gate electrode of the seventh transistor is connected to the reset signal line, and a first electrode of the seventh transistor is connected to the initialization signal line, and a second electrode of the seventh transistor is connected to the light-emitting element.

Optionally, the pixel driving circuit further includes: a second control sub-circuit, respectively connected to the first gate line, the initialization signal line and the second terminal of the first storage sub-circuit, and configured to control to connect or disconnect the initialization signal line and the second terminal of the first storage sub-circuit under the control of the first gate line.

Optionally, the second control sub-circuit includes a ninth transistor, a gate electrode of the ninth transistor is connected to the first gate line, and a first electrode of the ninth transistor is connected to the initialization signal line, and a second electrode of the ninth transistor is connected to the second terminal of the first storage sub-circuit.

Optionally, the driving sub-circuit includes a third transistor; the first storage sub-circuit includes a first capacitor, a first terminal of the first capacitor is connected to a gate electrode of the third transistor; the first reset sub-circuit includes a first transistor, a gate electrode of the first transistor is connected to the reset signal line, and a first electrode of the first transistor is connected to the first power line, a second electrode of the first transistor is connected to the gate electrode of the third transistor; the compensation sub-circuit includes a second transistor, a gate electrode of the second transistor is connected to the first gate line, a first electrode of the second transistor is connected to a first electrode of the third transistor, and a second electrode of the second transistor is connected to the gate electrode of the third transistor; the data writing-in sub-circuit includes a fourth transistor, a gate electrode of the fourth transistor is connected to the second gate line, and a first electrode of the fourth transistor is connected to the data line, a second electrode of the fourth transistor is connected to the second terminal of the first capacitor; the power control sub-circuit includes a fifth transistor, a gate electrode of the fifth transistor is connected to the light-emitting control signal line, a first electrode of the fifth transistor is connected to the first power line, and a second electrode of the fifth transistor is connected to the first electrode of the third transistor; the first control sub-circuit includes an eighth transistor, a gate electrode of the eighth transistor is connected to the first gate line, and a first electrode of the eighth transistor is connected to the initialization signal line, and a second electrode of the eighth transistor is connected to the second terminal of the driving sub-circuit.

In a second aspect, an embodiment of the present disclosure provides a display device including the pixel driving circuit.

Optionally, the display device includes a plurality of the pixel driving circuits arranged in an array, and the plurality of the pixel driving circuits are divided into a plurality of rows of pixel driving circuits; the display device further includes a gate driving circuit, a light-emitting signal control circuit, a plurality of first gate lines, a plurality of second gate lines, a plurality of reset signal lines and a plurality of light-emitting control signal lines; the gate driving circuit includes a plurality of first shift register units corresponding to the plurality of rows of pixel driving circuits in a one-to-one manner; the light-emitting signal control circuit includes a plurality of second shift register units; the plurality of first gate lines are in one-to-one correspondence with the plurality of first shift register units and the plurality of rows of pixel driving circuits, and each pixel driving circuit included in each row of pixel driving circuits is connected to a corresponding first gate line, and the first gate line is connected to an output terminal of a corresponding first shift register unit; the plurality of second gate lines are in one-to-one correspondence with the plurality of rows of pixel driving circuits, each pixel driving circuit included in each row of pixel driving circuits is connected to a corresponding second gate line, and the second gate line corresponding to a current row of the pixel driving circuits is connected to an output terminal of a first shift register unit corresponding to an adjacent next row of the pixel driving circuits; the plurality of reset signal lines are in one-to-one correspondence with the plurality of rows of pixel driving circuits, and each pixel driving circuit included in each row of pixel driving circuits is connected to a corresponding reset signal line, a reset signal line corresponding to the current row of pixel driving circuits is connected to an output terminal of a first shift register unit corresponding to an adjacent previous row of the pixel driving circuits; the plurality of light-emitting control signal lines are in one-to-one correspondence with the plurality of rows of pixel driving circuits, each pixel driving circuit included in each row of pixel driving circuits is connected to a corresponding light-emitting control signal line, and an output terminal of each second shift register unit is connected to at least one corresponding light-emitting control signal line.

In a third aspect, an embodiment of the present disclosure provides a method for driving the pixel driving circuit, wherein the method comprises: in each working cycle, in a reset period, the first power line inputs a power supply voltage Vd, and under the control of the reset signal line, the first reset sub-circuit controls to connect the first power line and the control terminal of the driving sub-circuit; in a threshold compensation period, under the control of the reset signal line, the first reset sub-circuit controls to disconnect the first power line from the control terminal of the driving sub-circuit; the initialization signal line inputs an initialization voltage Vinit, and under the control of the first gate line, the first control sub-circuit controls to connect the initialization signal line and the second terminal of the driving sub-circuit, and the compensation sub-circuit controls to connect the control terminal of the driving sub-circuit and the first terminal of the driving sub-circuit, so that a connection state between the first terminal and the second terminal of the driving sub-circuit is changed from on to off, a potential of the control terminal of the driving sub-circuit changes from Vd to Vinit+Vth, wherein Vth is a threshold voltage corresponding to the driving sub-circuit; in a data writing-in period, under the control of the first gate line, the first control sub-circuit controls to disconnect the initialization signal line from the second terminal of the driving sub-circuit, and the compensation sub-circuit controls to disconnect the control terminal of the driving sub-circuit from the first terminal of the driving sub-circuit; the data line inputs a data voltage Vdata, and under the control of the second gate line, the data writing-in sub-circuit controls to connect the data line and the second terminal of the first storage sub-circuit, so that a potential of the second terminal of the first storage sub-circuit is changed to Vdata, a potential of the control terminal of the driving sub-circuit changes under an bootstrapping action of the first storage sub-circuit; in a light-emitting period, the power supply signal input terminal inputs the power supply voltage Vdd, and under the control of the light-emitting control signal line, the power supply control sub-circuit controls to connect the first power line and the first terminal of the driving sub-circuit, under the control of the second gate line, the data writing-in sub-circuit controls to disconnect the data line from the second terminal of the first storage sub-circuit, under the control of the control terminal of the driving sub-circuit, the driving sub-circuit controls to connect the first terminal of the driving sub-circuit and the second terminal of the driving sub-circuit to drive the light-emitting element to emit light.

Optionally, the pixel driving circuit further includes a light-emitting control sub-circuit, and the second terminal of the driving sub-circuit is connected to the light-emitting element through the light-emitting control sub-circuit; the light-emitting control sub-circuit is respectively connected to the light-emitting control signal line, the second terminal of the driving sub-circuit and the light-emitting element; the pixel driving circuit further includes a second storage sub-circuit, a first terminal of the second storage sub-circuit is connected to the control terminal of the driving sub-circuit, and a second terminal of the second storage sub-circuit is connected to the light-emitting element; the method further includes: in the reset period, the threshold compensation period and the data writing-in period, under the control of the light-emitting control signal line, the light-emitting control sub-circuit controls to disconnect the second terminal of the driving sub-circuit from the light-emitting element; in the light-emitting period, under the control of the light-emitting control signal line, the light-emitting control sub-circuit controls to connect the second terminal of the driving sub-circuit and the light-emitting element, a potential of the control terminal of the driving sub-circuit changes under a bootstrapping action of the second storage sub-circuit.

Optionally, the pixel driving circuit further comprises a second reset sub-circuit, and the second reset sub-circuit is connected to the reset signal line, the initialization signal line and the light-emitting element; in the reset period, under the control of the reset signal line, the pixel driving circuit controls to connect the initialization signal line and the light-emitting element; in the threshold compensation period, the data writing-in period and the light-emitting period, under the control of the reset signal line, the pixel driving circuit controls to disconnect the initialization signal line from the light-emitting elements.

Optionally, the pixel driving circuit further includes a second control sub-circuit, the second control sub-circuit is connected to the first gate line, the initialization signal line and the second terminal of the first storage sub-circuit; in the reset period, the data writing-in period and the light-emitting period, under the control of the first gate line, the second control sub-circuit controls to disconnect the initialization signal line from the second terminal of the first storage sub-circuit; in the threshold compensation period, under the control of the first gate line, the second control sub-circuit controls to connect the initialization signal line and the second terminal of the first storage sub-circuit.

BRIEF DESCRIPTION OF THE DRAWINGS

The accompanying drawings described herein are used to provide further understanding of the present disclosure and constitute a part of the present disclosure. The exemplary embodiments of the present disclosure and the descriptions thereof are used to explain the present disclosure and do not constitute an improper limitation of the present disclosure.

DETAILED DESCRIPTION

In order to further illustrate the pixel driving circuit, the driving method thereof, and the display device provided by the embodiments of the present disclosure, the following detailed description is given with reference to the accompanying drawings.

Figure 1:
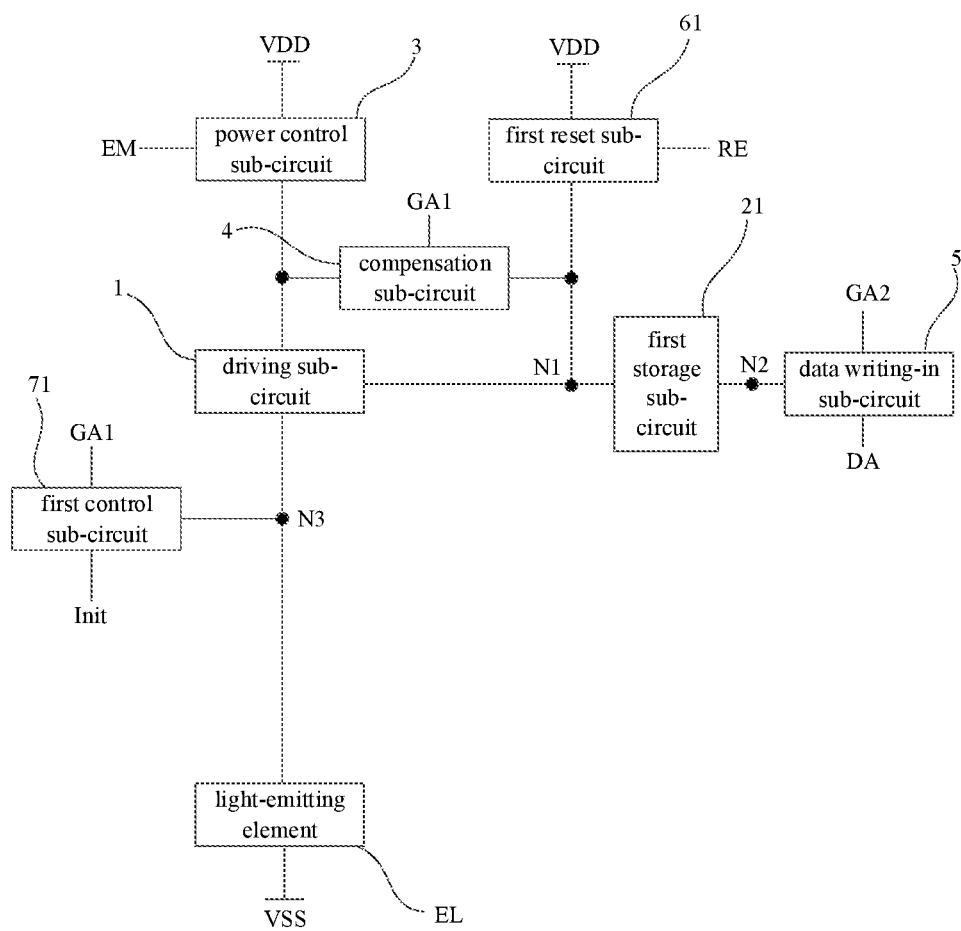
FIG. 1 is a schematic diagram of a first structure of a pixel driving circuit provided by an embodiment of the present disclosure.

Referring to FIG. 1, an embodiment of the present disclosure provides a pixel driving circuit for driving a light-emitting element EL, and the pixel driving circuit includes:
- a driving sub-circuit 1, wherein the driving sub-circuit 1 is used to control to connect or disconnect a first terminal of the driving sub-circuit 1 and a second terminal of the driving sub-circuit 1 under the control of a control terminal of the driving sub-circuit 1, the second terminal of the driving sub-circuit 1 is connected to the light-emitting element EL;
- a first storage sub-circuit 21, wherein a first terminal of the first storage sub-circuit 21 is connected to the control terminal;
- a power control sub-circuit 3, respectively connected to a light-emitting control signal line EM, a first power line VDD and the first terminal of the driving sub-circuit 1, and configured to control to connect or disconnect the first power line VDD and the first terminal of the driving sub-circuit 1 under the control of the light-emitting control signal line EM;
- a compensation sub-circuit 4, respectively connected to a first gate line GA1, the control terminal of the driving sub-circuit 1 and the first terminal of the driving sub-circuit 1, and configured to control to connect or disconnect the control terminal of the driving sub-circuit 1 and the first terminal of the driving sub-circuit 1;
- a data writing-in sub-circuit 5, respectively connected to a second gate line GA2, a data line DA and a second terminal of the first storage sub-circuit 21, and configured to control to connect or disconnect the data line DA and the second terminal of the first storage sub-circuit 21 under the control of the second gate line GA2;
- a first reset sub-circuit 61, respectively connected to a reset signal line RE, the first power supply line VDD and the control terminal of the driving sub-circuit 1, and configured to control to connect or disconnect the first power line VDD and the control terminal of the driving sub-circuit 1 under the control of the reset signal line RE;
- a first control sub-circuit 71, respectively connected to the first gate line GA1, an initialization signal line Init and the second terminal of the driving sub-circuit 1, and configured to control to connect or disconnect the initialization signal line Init and the second terminal of the driving sub-circuit 1 under the control of the first gate line GA1.

Specifically, the pixel driving circuit is applied to a display device, and the display device includes a substrate, a plurality of pixel driving circuits arranged on the substrate in an array, and a plurality of light-emitting elements EL arranged on a side of the plurality of pixel driving circuits away from the substrate and corresponding to the plurality of pixel driving circuits in a one-to-one manner. Exemplarily, the light-emitting element EL specifically includes an anode, a light-emitting functional layer, and a cathode that are sequentially stacked in a direction away from the substrate, and the anode of the light-emitting element EL can be connected to the corresponding pixel driving circuit and receive the driving signal provided by the corresponding pixel driving circuit, the cathode can be connected to a negative power supply signal line VSS in the display device, and receives a negative power supply signal inputted by the negative power supply signal line VSS, and the light-emitting functional layer is used to emit light under the combined action of the cathode and the anode.

It should be noted that the initialization signal inputted by the initialization signal line Init, the first power supply signal inputted by the first power supply line VDD, and the negative power supply signal inputted by the negative power supply signal line VSS are all constant voltage signals, wherein the potential of the initialization signal Vinit is less than the potential of the negative power signal, and the potential of the negative power signal is less than the potential Vd of the first power signal. Exemplarily, Vinit is −3V, the potential of the negative power signal is −2.4V, and Vd is 4.6V.

Figure 7:
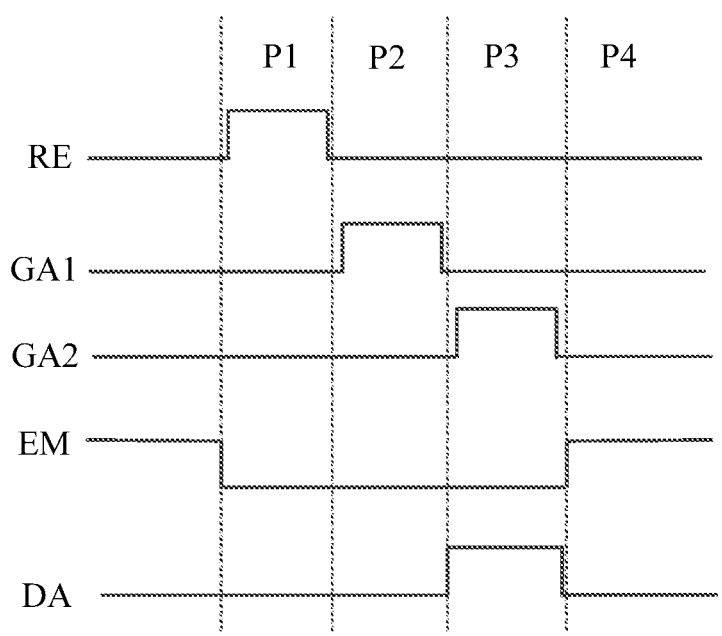
FIG. 7 is a working timing diagram of a pixel driving circuit provided by an embodiment of the present disclosure.
Figure 8:
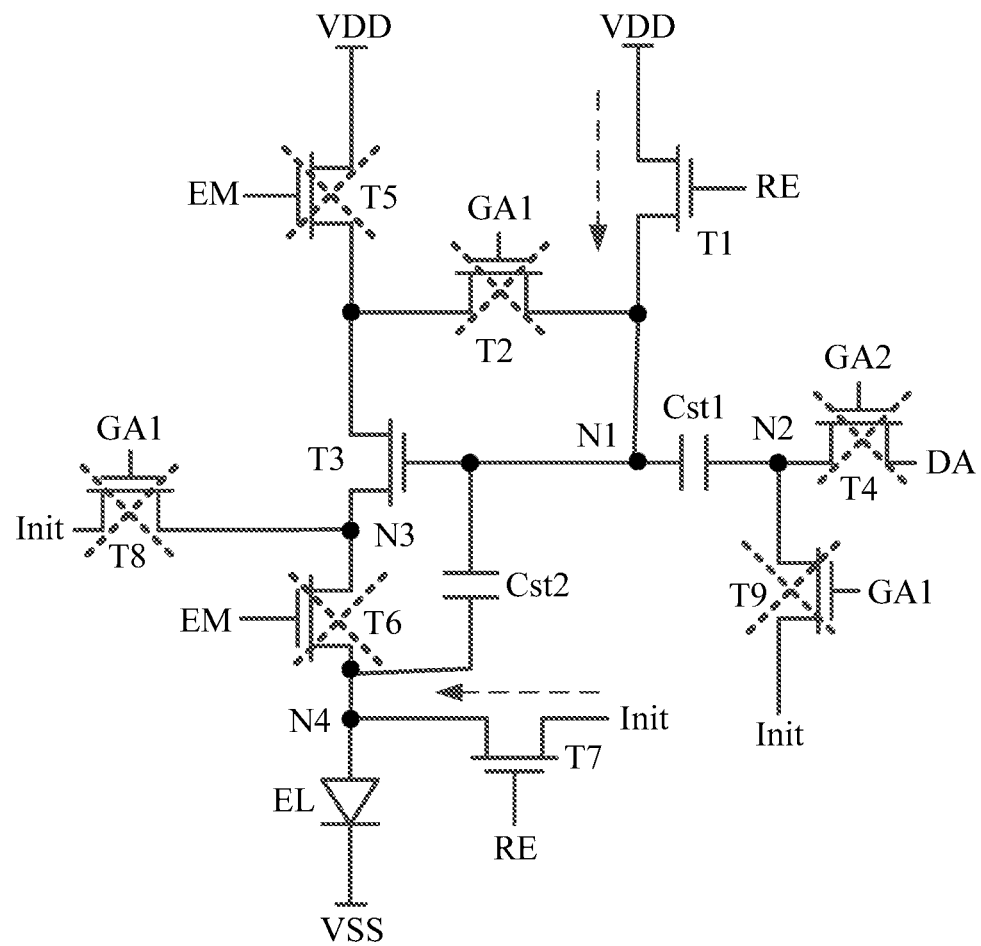
FIG. 8 is a schematic diagram of the operation of a pixel driving circuit in a reset period provided by an embodiment of the present disclosure.

Referring to FIGS. 1 and 6-11, the working process of the pixel driving circuit in one driving cycle is:

In the reset period P1, as shown in FIG. 7 and FIG. 8, the first power supply line VDD inputs the power supply voltage Vd, and under the control of the reset signal inputted by the reset signal line RE, the first reset sub-circuit 61 controls to connect or disconnect the first power supply line VDD and the control terminal of the driving sub-circuit 1, so that the potential of the control terminal (i.e. the N1 node) of the driving sub-circuit 1 become Vd, and the control terminal of the driving sub-circuit 1 is reset. It should be noted that the dotted lines with arrows in FIGS. 8 to 11 represent signal trends.

Figure 9:
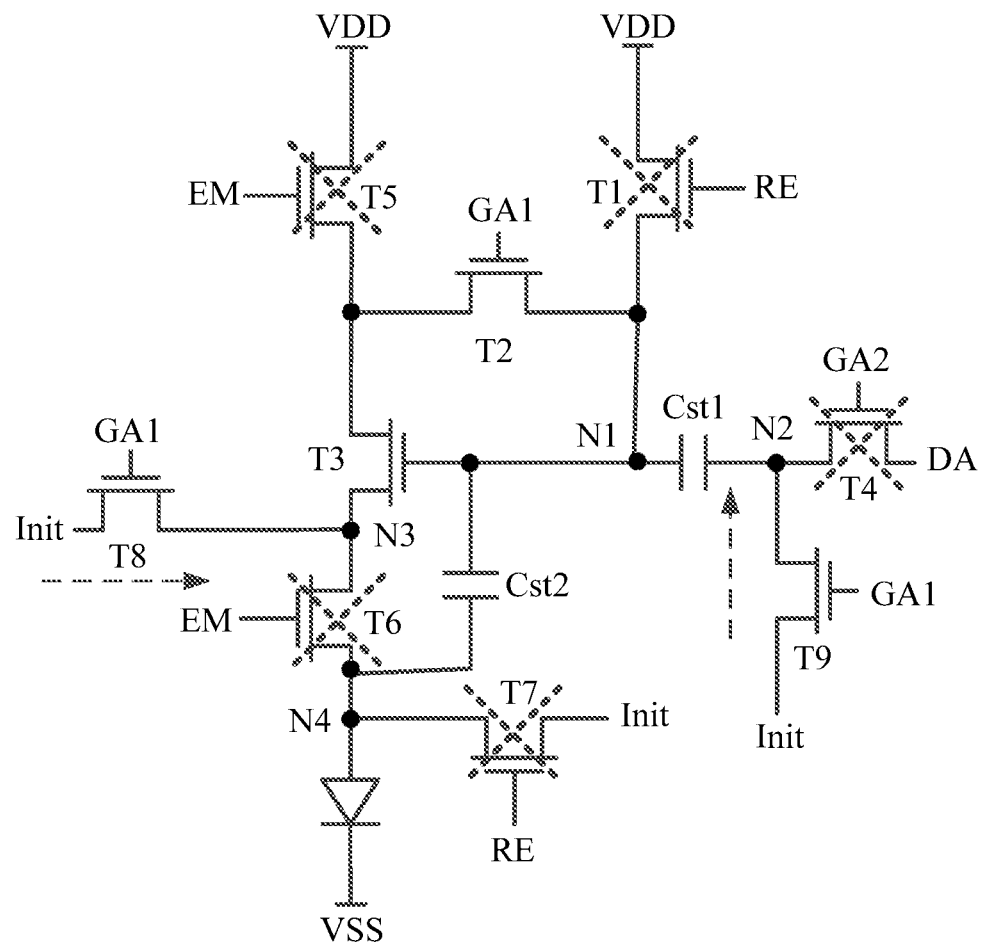
FIG. 9 is a schematic diagram of the operation of a pixel driving circuit in a threshold compensation period provided by an embodiment of the present disclosure.

In the threshold compensation period P2, as shown in FIG. 7 and FIG. 9, under the control of the reset signal inputted by the reset signal line RE, the first reset sub-circuit 61 controls to disconnect the first power line VDD from the control terminal of the driving sub-circuit 1; the initialization signal line Init inputs the initialization voltage Vinit, and under the control of the first scan signal inputted by the first gate line GA1, the first control sub-circuit 71 controls to connect the initialization signal line Init and the second terminal of the driving sub-circuit 1 (i.e., the N3 node), so that the potential of the second terminal of the driving sub-circuit 1 become Vinit; at the same time, under the control of the first scan signal inputted by the first gate line GA1, the compensation sub-circuit 4 controls to connect the control terminal of the driving sub-circuit 1 and the first terminal of the driving sub-circuit 1. The potential of the control terminal of the driving sub-circuit becomes Vd in the reset period P1, so that the driving sub-circuit 1 can connect the first terminal and the second terminal of the driving sub-circuit 1, and the connection between the first terminal and the second terminal of the driving sub-circuit 1 goes through the process of turning on to off, realizing the charging of the N1 node, so that the potential of the N1 node finally changes from Vd to Vinit+Vth, where Vth is the threshold voltage of the driving sub-circuit 1.

Figure 10:
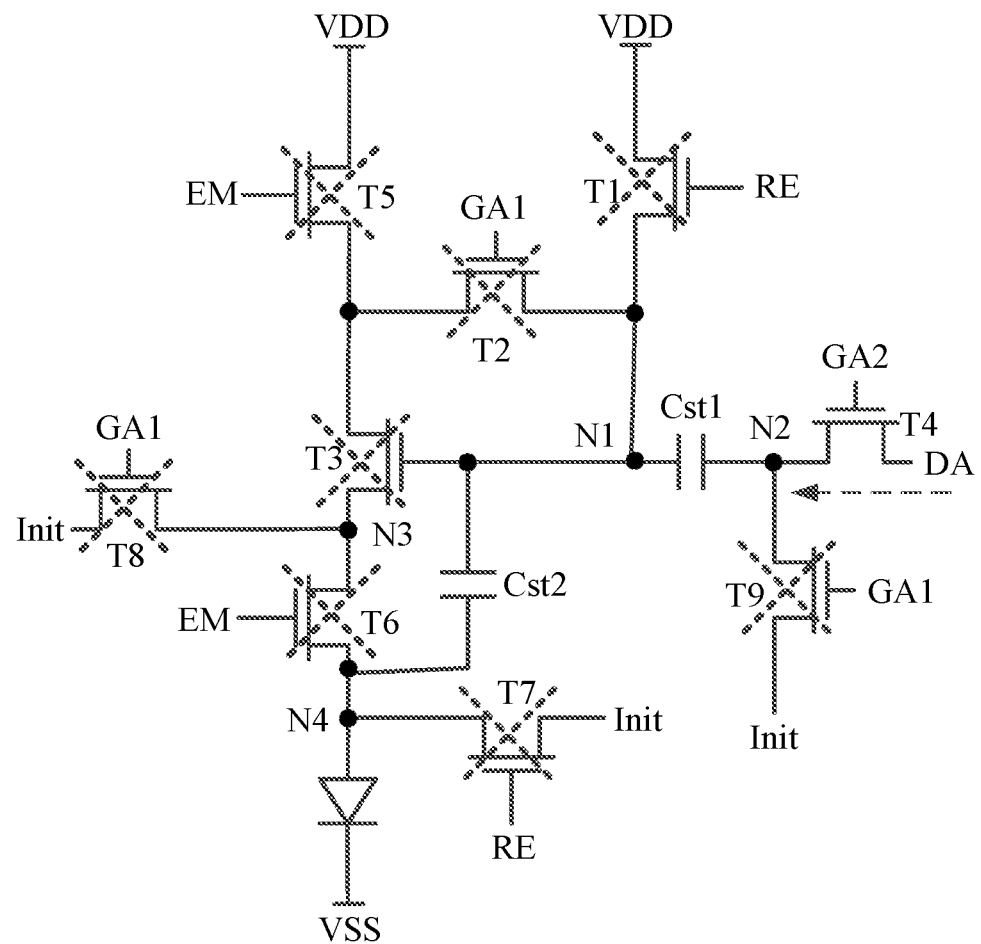
FIG. 10 is a schematic diagram of the operation of the pixel driving circuit in a data writing-in period provided by an embodiment of the present disclosure.

In the data writing-in period P3, as shown in FIG. 7 and FIG. 10, under the control of the first scan signal inputted by the first gate line GA1, the first control sub-circuit 71 controls to disconnect the initialization signal line Init from the second terminal of the driving sub-circuit 1; under the control of the first scan signal inputted by the first gate line GA1, the compensation sub-circuit 4 controls to disconnect the control terminal of the driving sub-circuit 1 from the first terminal of the driving sub-circuit 1; the data line DA inputs the data voltage Vdata, and under the control of the second scan signal inputted by the second gate line GA2, the data writing-in sub-circuit 5 controls to connect the data line DA and the second terminal of the first storage sub-circuit 21, so that the potential of the second terminal (i.e. the N2 node) of the first storage sub-circuit 21 become Vdata. The control terminal of the driving sub-circuit 1 is in a floating state in the data writing-in period P3, and the potential of the control terminal of the driving sub-circuit 1 changes correspondingly under the bootstrapping action of the first storage sub-circuit 21. Exemplarily, the initial potential of the second terminal of the first storage sub-circuit 21 is 0, then after writing the data voltage Vdata, the change amount of the potential of the second terminal of the first storage sub-circuit 21 is Vdata. Under the bootstrapping action of the first storage sub-circuit 21, the potential of the control terminal of the driving sub-circuit 1 correspondingly becomes Vinit+Vth+Vdata.

Figure 11:
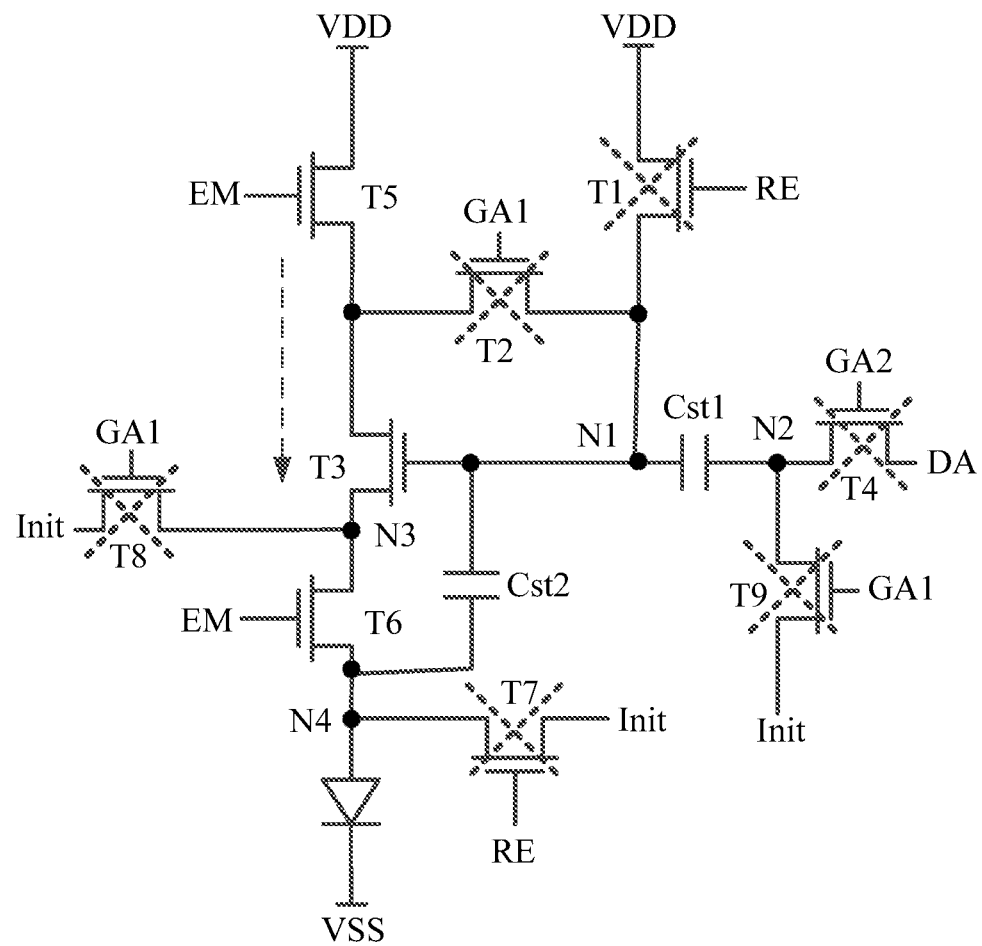
FIG. 11 is a schematic diagram of the operation of the pixel driving circuit in a light-emitting period provided by an embodiment of the present disclosure.

In the light-emitting period P4, as shown in FIG. 7 and FIG. 11, the power supply signal input terminal inputs the power supply voltage Vdd, and under the control of the light-emitting control signal inputted by the light-emitting control signal line EM, the power supply control sub-circuit 3 controls to connect the first power supply line VDD and the first terminal of the driving sub-circuit 1; under the control of the second scanning signal written by the second gate line GA2, the data writing-in sub-circuit 5 controls to disconnect the data line DA from the second terminal of the first storage sub-circuit 21; under the control of the control terminal of the driving sub-circuit 1, the driving sub-circuit 1 controls to connect the first terminal of the driving sub-circuit 1 and the second terminal of the driving sub-circuit 1, to drive the light-emitting element EL to emit light.

According to the specific structure of the pixel driving circuit and the working process of the pixel driving circuit in one driving cycle, in the pixel driving circuit provided by the embodiments of the present disclosure, in the threshold compensation period P2, the N1 node is charged, so that the potential of the N1 node is changed from Vd to Vinit+Vth; at the same time, the initialization signal line Init is controlled to be connected to the second terminal of the driving sub-circuit 1 (i.e., the N3 node), so that the potential of the second terminal of the driving sub-circuit 1 becomes Vinit; in the data writing-in period P3, the data voltage Vdata is written-in, so that the potential of the control terminal of the driving sub-circuit 1 becomes Vinit+Vth+Vdata; in the light-emitting period P4, the power control sub-circuit 3 controls to connect the first power supply line VDD and the first terminal of the driving sub-circuit 1, so that the driving sub-circuit 1 controls to connect the first terminal of the driving sub-circuit 1 and the second terminal of the driving sub-circuit 1 under the control of the control terminal of the driving sub-circuit 1. At this time, the voltage Vgs between the control terminal and the second terminal of the driving sub-circuit 1 is:

$$Vgs = Vinit + Vth + Vdata - Voled \qquad \text{Formula (1)}$$

Voled is the operating voltage of the light-emitting element EL, and the driving current I generated when the driving sub-circuit 1 connects its first terminal and the second terminal and operates in a saturated state is:

$$I = k(Vgs - Vth)^2 \quad \text{Formula (2)}$$

Substitute formula (1) into formula (2) to get:

$$I = k(Vinit + Vdata - Voled)^2 \quad \text{Formula (3)}$$

In the formula (3), k is a constant related to an aspect ratio and mobility of the transistor included in the driving sub-circuit 1.

It can be seen from formula (3) that the driving current I is not related to the threshold voltage Vth corresponding to the driving sub-circuit and the power supply voltage Vd; therefore, in the pixel driving circuit provided by the embodiment of the present disclosure, the influence of threshold voltage Vth drift and the power supply voltage Vd on the driving current I is eliminated, thereby effectively improves the uniformity of the driving current and ensuring the uniformity of the display brightness of the display device.

In addition, when the pixel driving circuit provided by the embodiment of the present disclosure is applied to a display device, the display device includes a plurality of pixel driving circuits arranged in an array, and the first gate line GA1 correspondingly connected to the pixel driving circuit of the current row can be set to input the first scan signal, which can be multiplexed into the reset signal inputted by the reset signal line RE connected to the pixel driving circuit of an adjacent next row; the first scan signal can also be multiplexed into the second scan signal inputted by the second gate line GA2 correspondingly connected to the pixel driving circuit of an adjacent previous row; therefore, when the pixel driving circuit provided by the embodiment of the present disclosure is applied to a display device, the pixel driving circuit only needs gateGOA and EMGOA to provide corresponding signals, fewer control signals are required and it is compatible with existing GOA designs at the same time.

Figure 2:
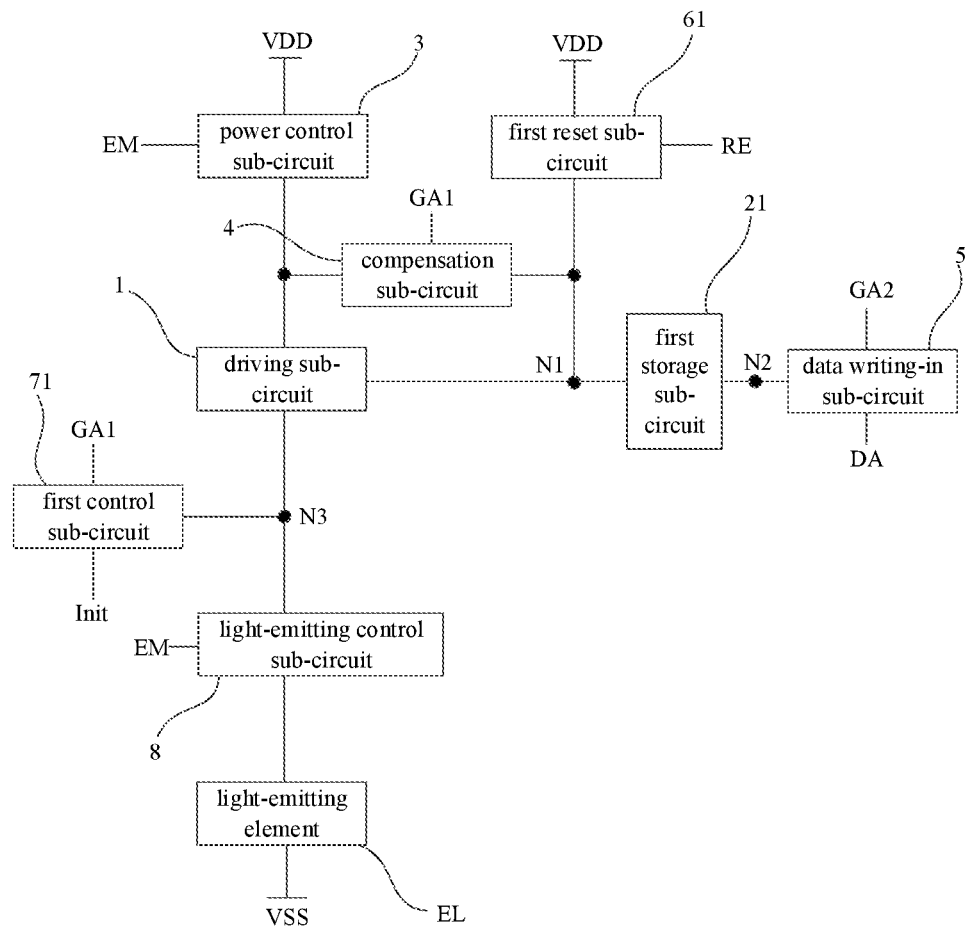
FIG. 2 is a schematic diagram of a second structure of a pixel driving circuit provided by an embodiment of the present disclosure.
Figure 6:
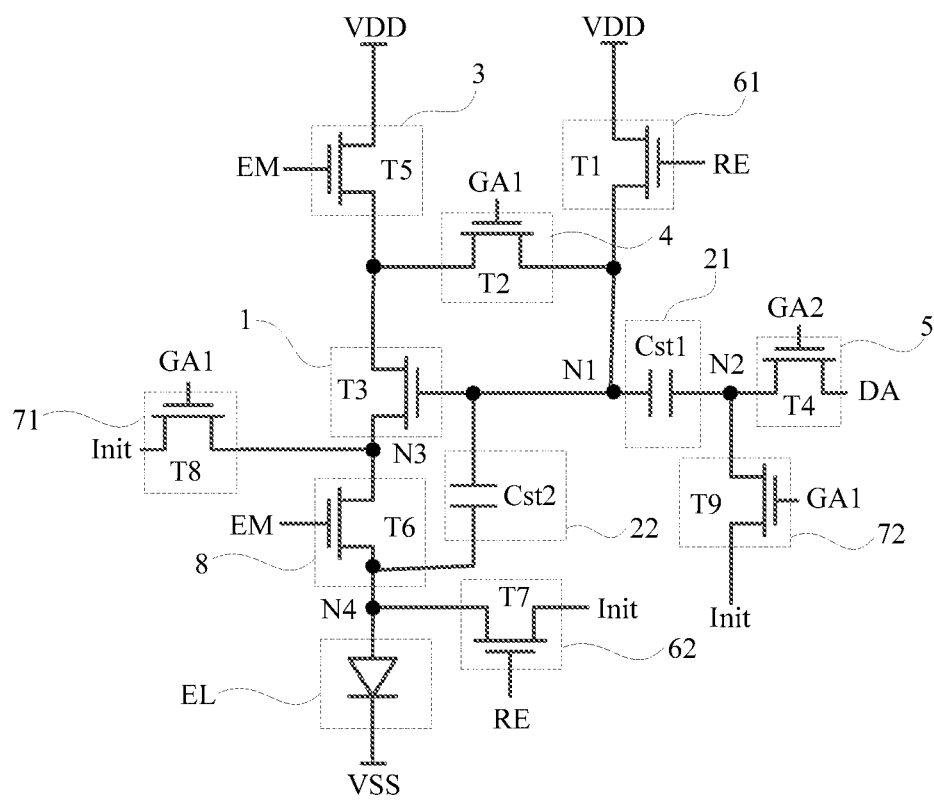
FIG. 6 is a schematic circuit diagram of a pixel driving circuit according to an embodiment of the present disclosure.

As shown in FIG. 2 and FIG. 6, in some embodiments, the pixel driving circuit further includes a light-emitting control sub-circuit 8, and the second terminal of the driving sub-circuit 1 is connected to the light-emitting element El through the light-emitting control sub-circuit 8. The light-emitting control sub-circuit 8 is respectively connected to the light-emitting control signal line EM, the second terminal of the driving sub-circuit 1 and the light-emitting element EL, configured to control to connect or disconnect the second terminal of the driving sub-circuit 1 and the light-emitting element EL under the control of the light-emitting control signal line EM.

Specifically, as shown in FIG. 7 and FIG. 11, in the light-emitting period P4, under the control of the light-emitting control signal line EM, the light-emitting control sub-circuit 8 controls to connect the second terminal of the driving sub-circuit 1 to the light-emitting element EL.

As shown in FIGS. 7 to 10, in the reset period P1, the threshold compensation period P2 and the data writing-in period P3, under the control of the light-emitting control signal line EM, the light-emitting control sub-circuit 8 controls to disconnect the second terminal of the driving sub-circuit and the light-emitting element EL, which can prevent the light-emitting element EL from emitting abnormally in the reset period P1, the threshold compensation period P2 and the data writing-in period P3.

Figure 3:
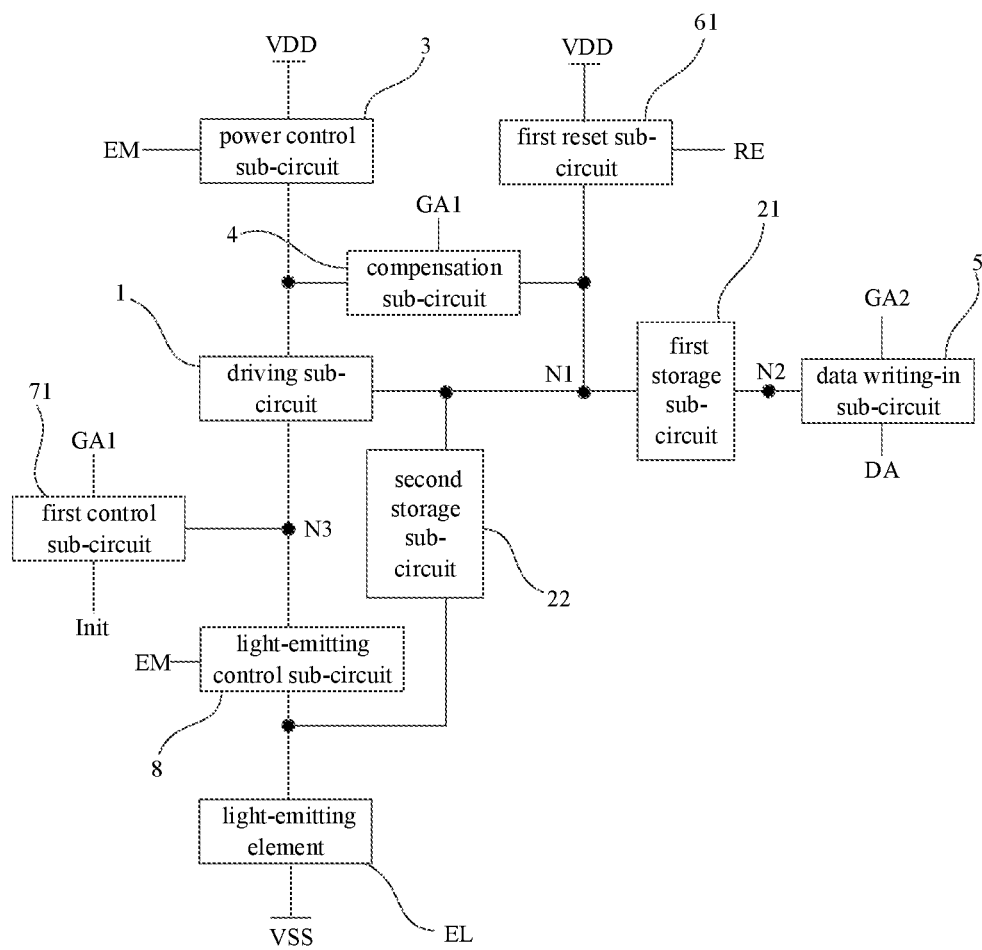
FIG. 3 is a schematic diagram of a third structure of a pixel driving circuit provided by an embodiment of the present disclosure.

As shown in FIG. 3 and FIG. 6, in some embodiments, the pixel driving circuit further includes: a second storage sub-circuit 22, the first terminal of the second storage sub-circuit 22 is connected to the control terminal of the driving sub-circuit 1, and the second terminal of the second storage sub-circuit 22 is connected to the light-emitting element EL.

Exemplarily, the second storage sub-circuit 22 includes a second capacitor Cst2, a first terminal of the second capacitor Cst2 is connected to the control terminal of the driving sub-circuit 1, and a second terminal of the second capacitor Cst2 is connected to the light-emitting element EL.

As shown in FIG. 11, in the light-emitting period P4, the light-emitting element EL emits light, the potential of the N4 node jumps from Vinit to Voled, and Voled is the working voltage of the light-emitting element EL. At the same time, due to the coupling effect of the second storage sub-circuit 22, the potential of the N1 node jumps from Vinit+Vth+Vdata to Vinit+Vth+Vdata+(Voled−Vinit), that is, the potential of the N1 node becomes Vth+Vdata+Voled.

At this time, the voltage Vgs between the control terminal and the second terminal of the driving sub-circuit 1 is:

$$Vgs = Vth + Vdata + Voled - Voled = Vth + Vdata \quad \text{Formula (4)}$$

Voled is the operating voltage of the light-emitting element EL, and the driving current I generated when the driving sub-circuit 1 connects its first terminal and the second terminal and operates in a saturated state is:

$$I = k(Vgs - Vth)^2 = k(Vdata)^2 \quad \text{Formula (5)}$$

It can be seen from formula (5) that the driving current I is not related to the working voltage Voled of the light-emitting element EL; therefore, in the pixel driving circuit provided by the embodiment of the present disclosure, the influence of Voled on the driving current I is eliminated, and the uniformity of the display brightness of the display device is guaranteed. In addition, the pixel driving circuit provided by the embodiment of the present disclosure also eliminates the influence of the negative power supply signal inputted by the negative power supply signal line VSS connected to the light-emitting element EL on the driving current I.

As shown in FIG. 6, in some embodiments, the light-emitting control sub-circuit 8 includes a sixth transistor T6, a gate electrode of the sixth transistor T6 is connected to the light-emitting control signal line EM, and a first electrode of the sixth transistor T6 is connected to the second terminal of the driving sub-circuit 1, and a second electrode of the sixth transistor T6 is connected to the light-emitting element EL.

Specifically, as shown in FIG. 7 and FIG. 11, in the light-emitting period P4, under the control of the light-emitting control signal line EM, the sixth transistor T6 is turned on, so as to control to connect the second terminal of the driving sub-circuit 1 and all light-emitting elements EL.

As shown in FIGS. 7 to 10, in the reset period P1, the threshold compensation period P2 and the data writing-in period P3, under the control of the light-emitting control signal line EM, the sixth transistor T6 is turned off, thereby controlling to disconnect the second terminal of the driving sub-circuit 1 and the light-emitting element EL, which can prevent the light-emitting element EL from emitting light abnormally in the reset period P1, the threshold compensation period P2 and the data writing-in period P3.

Figure 4:
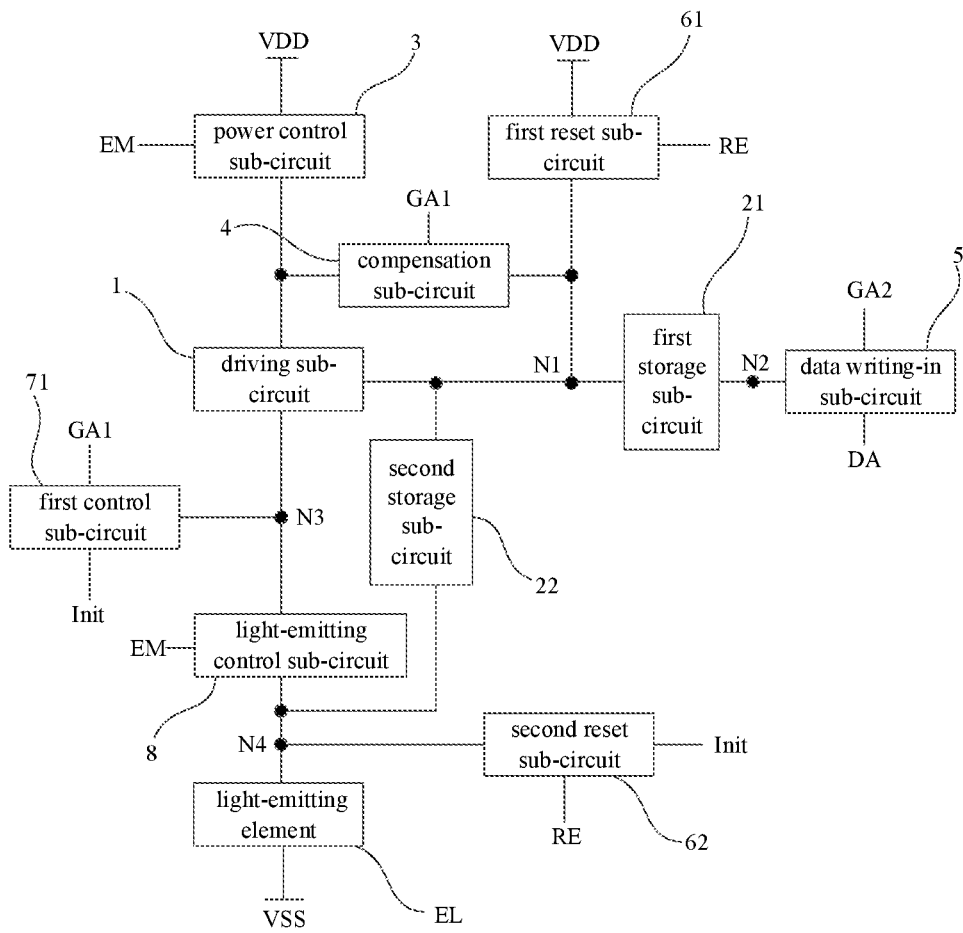
FIG. 4 is a schematic diagram of a fourth structure of a pixel driving circuit provided by an embodiment of the present disclosure.

As shown in FIG. 4 and FIG. 6, in some embodiments, the pixel driving circuit further includes: a second reset sub-circuit 62, the second reset sub-circuit 62 is respectively connected to the reset signal line RE, the initialization signal line Init and the light-emitting element EL, and is used to control to connect or disconnect the initialization signal line Init and the light-emitting element EL under the control of the reset signal line RE.

As shown in FIG. 7 and FIG. 8, in the reset period P1, under the control of the reset signal line RE, the second reset sub-circuit 62 controls to connect the initialization signal line Init and the anode of the light-emitting element EL, to realize the reset of the anode of the light-emitting element EL.

As shown in FIG. 7, FIG. 9 to FIG. 11, in the threshold compensation period P2, the data writing-in period P3 and the light-emitting period P4, the second reset sub-circuit 62 controls to disconnect the initialization signal line Init from the anode of the light-emitting element EL.

As shown in FIG. 6, in some embodiments, the second reset sub-circuit 62 includes a seventh transistor T7, a gate electrode of the seventh transistor T7 is connected to the reset signal line RE, and a first electrode of the seventh transistor T7 is connected to the initialization signal line Init, and a second electrode of the seventh transistor T7 is connected to the light-emitting element EL.

As shown in FIG. 7 and FIG. 8, in the reset period P1, under the control of the reset signal line RE, the seventh transistor T7 is turned on, and the initialization signal line Init is connected to the anode of the light-emitting element EL, to realize the reset of the anode of the light-emitting element EL.

As shown in FIG. 7, FIG. 9 to FIG. 11, in the threshold compensation period P2, the data writing-in period P3 and the light emitting period P4, the seventh transistor T7 is turned off, and the initialization signal line Init is disconnected from the the anode of the light emitting element EL.

Figure 5:
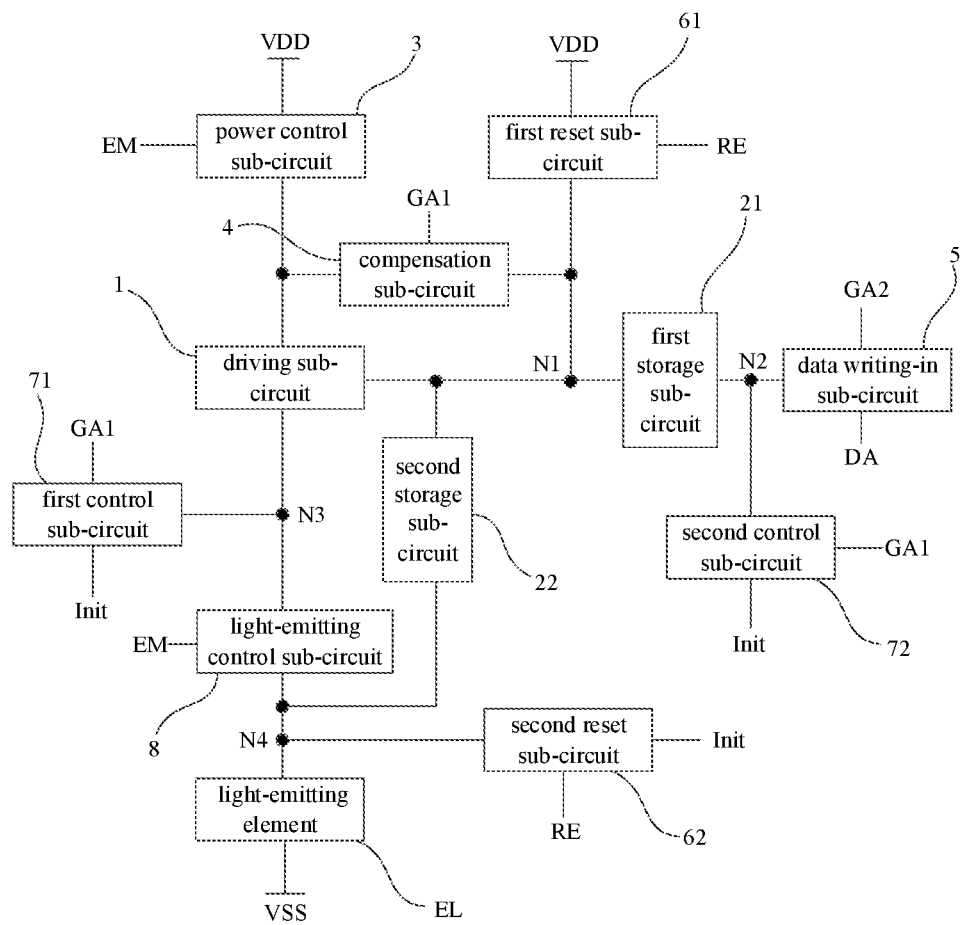
FIG. 5 is a schematic diagram of a fifth structure of a pixel driving circuit provided by an embodiment of the present disclosure.

As shown in FIG. 5 and FIG. 6, in some embodiments, the pixel driving circuit further includes:

a second control sub-circuit 72, respectively connected to the first gate line GA1, the initialization signal line Init and the second terminal of the first storage sub-circuit 21, and configured to, under the control of the first gate line GA1, controls to connect or disconnect the initialization signal line Init and the second terminal of the first storage sub-circuit 21.

Specifically, as shown in FIG. 7, FIG. 8, FIG. 10 and FIG. 11, in the reset period P1, the data writing-in period P3 and the light-emitting period P4, under the control of the first gate line GA1, the second control sub-circuit 72 controls to disconnect the initialization signal line Init from the second terminal of the first storage sub-circuit 21.

As shown in FIG. 7 and FIG. 9, in the threshold compensation period P2, under the control of the first gate line GA1, the second control sub-circuit 72 controls to connect the initialization signal line Init and the second terminal of the first storage sub-circuit 21, the potential of the N2 node is written-in and maintained at Vinit.

In the data writing-in period P3, the change amount of the potential of the N2 node is Vdata−Vinit, and under the bootstrapping action of the first storage sub-circuit 21, the potential of the N1 node becomes Vinit+Vth+Vdata−Vinit, namely, Vth+Vdata.

When the pixel driving circuit includes the light-emitting control sub-circuit 8 and the second storage sub-circuit 22, in the light-emitting period P4, under the action of the second storage sub-circuit 22, the potential of the N1 node becomes Vth+Vdata+Voled−Vinit, Vgs=Vth+Vdata+Voled−Vinit−Voled=Vth+Vdata−Vinit.

The driving current I is:

$$I=k(Vgs-Vth)^2=I=k(V\text{data}-V\text{init})^2 \quad \text{Formula (6)}$$

It can be seen from formula (6) that the driving current I is not related to the operating voltage Voled of the light-emitting element EL, the threshold voltage Vth corresponding to the driving sub-circuit 1, and the power supply voltage Vd.

The above-described pixel driving circuit further includes a second control sub-circuit 72, so that before the data writing-in period P3 starts, the N2 node has a stable potential, which is more conducive to the writing-in of the data signal.

As shown in FIG. 6, in some embodiments, the second control sub-circuit 72 includes a ninth transistor T9, a gate electrode of the ninth transistor T9 is connected to the first gate line GA1, and a first electrode of the ninth transistor T9 is connected to the initialization signal line Init, and a second electrode of the ninth transistor T9 is connected to the second terminal of the first storage sub-circuit 21.

As shown in FIG. 7, FIG. 8, FIG. 10 and FIG. 11, in the reset period P1, the data writing-in period P3 and the light-emitting period P4, under the control of the first gate line GA1, the ninth transistor T9 is turned off, to control to disconnect the initialization signal line Init from the second terminal of the first storage sub-circuit 21.

As shown in FIG. 7 and FIG. 9, in the threshold compensation period P2, under the control of the first gate line GA1, the ninth transistor T9 is turned on, to connect the initialization signal line Init and the first gate line Init and the second terminal of the first storage sub-circuit 21, the potential of the N2 node is written-in and maintained at Vinit.

As shown in FIG. 6, in some embodiments, the driving sub-circuit 1 includes a third transistor T3; the first storage sub-circuit 21 includes a first capacitor Cst1, the first terminal of the first capacitor Cst1 is connected to the gate electrode of the third transistor T3; the first reset sub-circuit 61 includes a first transistor T1, the gate electrode of the first transistor T1 is connected to the reset signal line RE, and the first electrode of the first transistor T1 is connected to the first power line VDD, the second electrode of the first transistor T1 is connected to the gate electrode of the third transistor T3; the compensation sub-circuit 4 includes a second transistor T2, the gate electrode of the second transistor T2 is connected to the first gate line GA1, the first electrode of the second transistor T2 is connected to the first electrode of the third transistor T3, and the second electrode of the second transistor T2 is connected to the gate electrode of the third transistor T3; the data writing-in sub-circuit 5 includes a fourth transistor T4, the gate electrode of the fourth transistor T4 is connected to the second gate line GA2, and the first electrode of the fourth transistor T4 is connected to the data line DA, the second electrode of the fourth transistor T4 is connected to the second terminal of the first capacitor Cst1; the power control sub-circuit 3 includes a fifth transistor T5, the gate electrode of the fifth transistor T5 is connected to the light-emitting control signal line EM, the first electrode of the fifth transistor T5 is connected to the first power line VDD, and the second electrode of the fifth transistor T5 is connected to the first electrode of the third transistor T3; the first control sub-circuit 71 includes an eighth transistor T8, the gate electrode of the eighth transistor T8 is connected to the first gate line GA1, and the first electrode of the eighth transistor T8 is connected to the initialization signal line Init, and the second electrode of the eighth transistor T8 is connected to the second terminal of the driving sub-circuit 1.

Specifically, the driving sub-circuit 1 includes a third transistor T3, the gate electrode of the third transistor T3 is used as the control terminal of the driving sub-circuit 1, and the first electrode of the third transistor T3 is used as the first terminal of the driving sub-circuit 1 and the second electrode of the third transistor T3 is used as the second terminal of the driving sub-circuit 1.

As shown in FIG. 7 and FIG. 8, in the reset period P1, the first transistor T1, the third transistor T3 and the seventh transistor T7 are turned on, and the second transistor T2, the fourth transistor T4, the fifth transistor T5, the sixth transistor T6, the eighth transistor T8 and the ninth transistor T9 are all turned off.

As shown in FIG. 7 and FIG. 9, in the threshold compensation period P2, the second transistor T2, the third transistor T3, the eighth transistor T8 and the ninth transistor T9 are all turned on, and the first transistor T1, the fourth transistor T4, the fifth transistor T5, the sixth transistor T6, and the seventh transistor T7 are all turned off.

As shown in FIG. 7 and FIG. 10, in the data writing-in period P3, the fourth transistor T4 is turned on, and the rest of the transistors are turned off.

As shown in FIG. 7 and FIG. 11, in the light-emitting period P4, the third transistor T3, the fifth transistor T5 and the sixth transistor T6 are all turned on, and the first transistor T1, the second transistor T2, the fourth transistor T4, the seventh transistor T7, the eighth transistor T8 and the ninth transistor T9 are all turned off.

In the pixel driving circuit provided by the above embodiment, each transistor included can be selected as an N-type transistor, and the N-type transistor has the advantages of small hysteresis and compatibility with the design of oxide thin film transistors.

Embodiments of the present disclosure further provide a display device, including the pixel driving circuit provided by the above embodiments.

In the pixel driving circuit provided by the above embodiment, the driving current I is not related to the threshold voltage Vth corresponding to the driving sub-circuit and the power supply voltage Vd; the influence of the threshold voltage Vth drift and the power supply voltage Vd on the driving current I is eliminated, and the uniformity of the driving current is improved, and the uniformity of the display brightness of the display device is ensured. Therefore, when the display device provided by the embodiment of the present disclosure includes the above-mentioned pixel driving circuit, it also has the above-mentioned beneficial effects, which will not be repeated here.

It should be noted that the display device may be any product or component with a display function, such as a TV, a monitor, a digital photo frame, a mobile phone, and a tablet computer.

Figure 12:
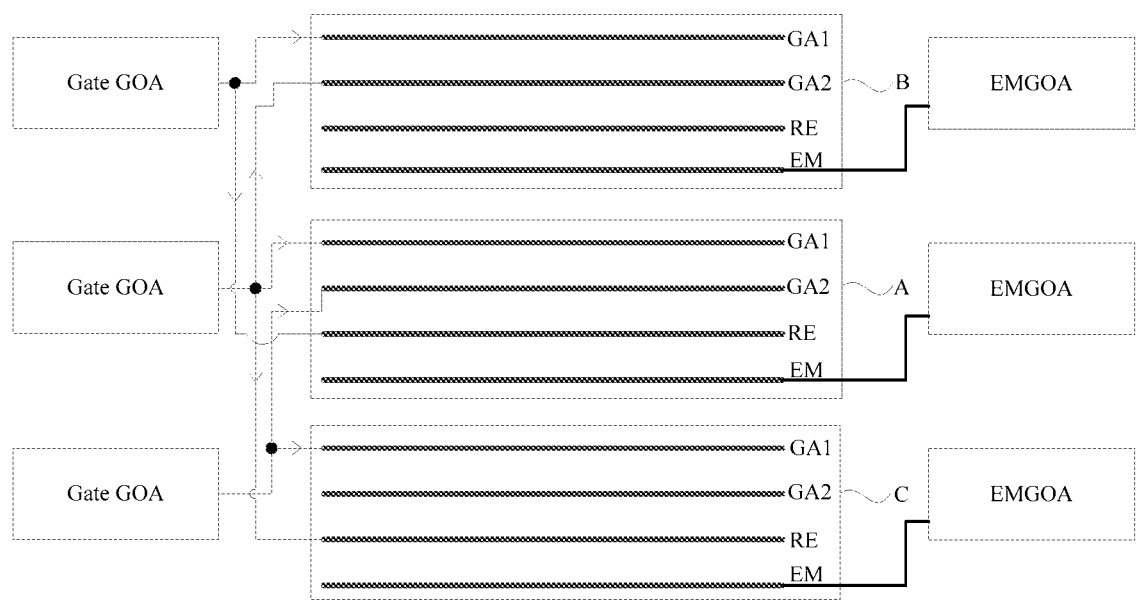
FIG. 12 is a schematic diagram of the connection of the Gate GOA provided by the embodiment of the present disclosure.

As shown in FIG. 12, in some embodiments, the display device includes a plurality of the pixel driving circuits arranged in an array, and the plurality of the pixel driving circuits are divided into multiple rows of pixel driving circuits; the display device further includes a gate driving circuit, a light-emitting signal control circuit, a plurality of first gate lines GA1, a plurality of second gate lines GA2, a plurality of reset signal lines RE and a plurality of light-emitting control signal lines EM;

The gate driving circuit includes a plurality of first shift register units Gate GOA corresponding to the plurality of rows of pixel driving circuits in a one-to-one manner; the light-emitting signal control circuit includes a plurality of second shift register units;

The plurality of first gate lines GA1 are in one-to-one correspondence with the plurality of first shift register units Gate GOA and the plurality of rows of pixel driving circuits, and each pixel driving circuit included in each row of pixel driving circuits is connected to the corresponding first gate line GA1, and the first gate line GA1 is connected to the output terminal of the corresponding first shift register unit Gate GOA;

The plurality of second gate lines GA2 are in one-to-one correspondence with the plurality of rows of pixel driving circuits, each pixel driving circuit included in each row of pixel driving circuits is connected to the corresponding second gate line GA2, and the second gate line GA2 corresponding to the current row of the pixel driving circuits (A in FIG. 12) is connected to the output terminal of the first shift register unit Gate GOA corresponding to an adjacent next row of the pixel driving circuits (C in FIG. 12);

The plurality of reset signal lines RE are in one-to-one correspondence with the multiple rows of pixel driving circuits, and each pixel driving circuit included in each row of pixel driving circuits is connected to the corresponding reset signal line RE. The reset signal line RE corresponding to the current row of pixel driving circuits (A in FIG. 12) is connected to the output terminal of the first shift register unit Gate GOA corresponding to an adjacent previous row of the pixel driving circuits (B in FIG. 12);

The plurality of light-emitting control signal lines EM are in one-to-one correspondence with the plurality of rows of pixel driving circuits, each pixel driving circuit included in each row of pixel driving circuits is connected to the corresponding light-emitting control signal line EM, and the output terminal of each second shift register unit is connected to the at least one corresponding light-emitting control signal line.

Specifically, the display device includes a plurality of the pixel driving circuits arranged in an array, and the plurality of the pixel driving circuits are divided into multiple rows of pixel driving circuits. Exemplarily, the multiple rows of pixel driving circuits are arranged in sequence along the Y direction, each row of pixel driving circuits include a plurality of pixel driving circuits arranged in sequence along the X direction. Exemplarily, the X direction is a horizontal direction, and the Y direction is a vertical direction.

Exemplarily, at least part of the first gate line GA1, at least part of the second gate line GA2, at least part of the reset signal line RE, and at least part of the light-emitting control signal line EM all extend along the X direction.

The gate driving circuit includes a plurality of first shift register units Gate GOA corresponding to the multiple rows of pixel driving circuits in a one-to-one manner; the light-emitting signal control circuit includes a plurality of second shift register units EMGOA.

Each pixel driving circuit included in each row of pixel driving circuits is multiplexed as a first gate line GA1 corresponding to the current row of pixel driving circuits. Each pixel driving circuit included in each row of pixel driving circuits is multiplexed as a second gate line GA2 corresponding to the current row of pixel driving circuits. Each pixel driving circuit included in each row of pixel driving circuits is multiplexed as the reset signal line RE corresponding to the current row of pixel driving circuits. Each pixel driving circuit included in each row of pixel driving circuits is multiplexed as the light-emitting control signal line EM corresponding to the current row of the pixel driving circuits.

Each pixel driving circuit included in each row of pixel driving circuits is connected to the corresponding second gate line GA2, and the signal transmitted by the second gate line GA2 corresponding to the current row of pixel driving circuits is the same as the signal transmitted by the first gate line GA1 corresponding to the adjacent next row of pixel driving circuits. Therefore, the second gate line GA2 corresponding to the current row of the pixel driving circuits and the first gate line GA1 corresponding to the adjacent next row of pixel driving circuits can be both connected to the output terminal of the first shift register unit corresponding to the adjacent next row of pixel driving circuits.

Each pixel driving circuit included in each row of pixel driving circuits is connected to the corresponding reset signal line RE, and the signal transmitted by the reset signal line RE corresponding to the current row of pixel driving circuits is the same as the signal transmitted by the first gate line GA1 corresponding to the adjacent previous row of pixel driving circuits. Therefore, the reset signal line RE corresponding to the current row of pixel driving circuits and the first gate line GA1 corresponding to the adjacent previous row of pixel driving circuit can be both connected to the output terminal of the first shift register unit corresponding to the adjacent previous row of the pixel driving circuit.

The plurality of light-emitting control signal lines EM are in one-to-one correspondence with the plurality of rows of pixel driving circuits, each pixel driving circuit included in each row of pixel driving circuits is connected to the corresponding light-emitting control signal line, and the output terminal of the second shift register unit is connected to the at least one corresponding light-emitting control signal line. It should be noted that when each second shift register unit corresponds to a plurality of light-emitting control signal lines, the plurality of light-emitting control signal lines are arranged adjacently, and each light-emitting control signal line only corresponds to one second shift register unit.

In the display device provided by the above embodiment, the first gate line GA1 connected to the current row of pixel driving circuits can be set to input a first scanning signal, and the first scanning signal can be multiplexed as the reset signal inputted by the reset signal line RE connected to the adjacent next row of pixel driving circuits; the first scanning signal can also be multiplexed as the second scanning signal inputted by the second gate line GA2 correspondingly connected to the adjacent previous row of pixel driving circuits; therefore, in the display device provided by the above embodiment, only gate GOA and EMGOA need to be set to provide corresponding signals for the pixel driving circuit, less control signals are required, and at the same time, the existing GOA design is compatible.

An embodiment of the present disclosure also provides a method for driving a pixel driving circuit, which is applied to the pixel driving circuit provided in the above-mentioned embodiment, and the driving method includes: in each working cycle, In the reset period P1, the first power line VDD inputs the power supply voltage Vd, and under the control of the reset signal line RE, the first reset sub-circuit 61 controls to connect the first power line VDD and the control terminal of the driving sub-circuit 1;

In the threshold compensation period P2, under the control of the reset signal line RE, the first reset sub-circuit 61 controls to disconnect the first power line VDD from the control terminal of the driving sub-circuit 1; the initialization signal line Init inputs the initialization voltage Vinit, and under the control of the first gate line GA1, the first control sub-circuit 71 controls to connect the initialization signal line Init and the second terminal of the driving sub-circuit 1, and the compensation sub-circuit 4 controls to connect the control terminal of the driving sub-circuit 1 and the first terminal of the driving sub-circuit 1, so that the connection between the first terminal and the second terminal of the driving sub-circuit 1 is changed from on to off, the potential of the control terminal of the driving sub-circuit 1 changes from Vd to Vinit+Vth, where Vth is the threshold voltage corresponding to the driving sub-circuit 1;

In the data writing-in period P3, under the control of the first gate line GA1, the first control sub-circuit 71 controls to disconnect the initialization signal line Init from the second terminal of the driving sub-circuit 1, and the compensation sub-circuit 4 controls to disconnect the control terminal of the driving sub-circuit 1 from the first terminal of the driving sub-circuit 1; the data line DA inputs the data voltage Vdata, and under the control of the second gate line GA2, the data writing-in sub-circuit 5 controls to connect the data line DA and the second terminal of the first storage sub-circuit 21, so that the potential of the second terminal of the first storage sub-circuit 21 becomes Vdata, the potential of the control terminal of the driving sub-circuit 1 changes under the bootstrapping action of the first storage sub-circuit 21;

In the light-emitting period P4, the power supply signal input terminal inputs the power supply voltage Vdd, and under the control of the light-emitting control signal line EM, the power supply control sub-circuit 3 controls to connect the first power supply line VDD and the first terminal of the driving sub-circuit 1, under the control of the second gate line GA2, the data writing-in sub-circuit 5 controls to disconnect the data line DA from the second terminal of the first storage sub-circuit 21, under the control of the control terminal of the driving sub-circuit 1, the driving sub-circuit 1 controls to connect the first terminal of the driving sub-circuit 1 and the second terminal of the driving sub-circuit 1 to drive the light-emitting element EL to emit light.

When the pixel driving circuit is driven by the method provided by the embodiment of the present disclosure, the driving current I is not related to the threshold voltage Vth corresponding to the driving sub-circuit, and the power supply voltage Vd; therefore, the method provided by the embodiment of the present disclosure is used to drive the pixel driving circuit, the influence of the threshold voltage Vth drift and the power supply voltage Vd on the driving current I is eliminated, the uniformity of the driving current is effectively improved, and the uniformity of the display brightness of the display device is ensured.

In some embodiments, the pixel driving circuit further includes a light-emitting control sub-circuit 8, and the second terminal of the driving sub-circuit 1 is connected to the light-emitting element EL through the light-emitting control sub-circuit 8; the light-emitting control sub-circuit 8 is respectively connected to the light-emitting control signal line EM, the second terminal of the driving sub-circuit 1 and the light-emitting element EL; the pixel driving circuit also includes a second storage sub-circuit 22, the first terminal of the second storage sub-circuit 22 is connected to the control terminal of the driving sub-circuit 1, and the second terminal of the second storage sub-circuit 22 is connected to the light-emitting element EL;

The driving method further includes:

In the reset period P1, the threshold compensation period P2 and the data writing-in period P3, under the control of the light-emitting control signal line EM, the light-emitting control sub-circuit 8 controls to disconnect the second terminal of the driving sub-circuit 1 from the light-emitting element EL;

In the light-emitting period P4, under the control of the light-emitting control signal line EM, the light-emitting control sub-circuit 8 controls to connect the second terminal of the driving sub-circuit 1 and the light-emitting element EL, the potential of the control terminal of the driving sub-circuit 1 changes under the bootstrapping action of the second storage sub-circuit 22.

In the light-emitting period P4, the light-emitting element EL emits light, the potential of the N4 node jumps from Vinit to Voled, and Voled is the operation voltage of the light-emitting element EL. At the same time, due to the coupling effect of the second storage sub-circuit 22, the potential of the N1 node is changed from Vinit+Vth+Vdata to Vinit+Vth+Vdata+(Voled−Vinit), that is, the potential of the N1 node becomes Vth+Vdata+Voled. At this time, the voltage Vgs between the control terminal and the second terminal of the driving sub-circuit 1 is: Vgs=Vth+Vdata+Voled−Voled=Vth+Vdata, Voled is the operation voltage of the light-emitting element EL, and the driving current I generated when the first terminal and the second terminal of driving sub-circuit 1 are connected and the driving sub-circuit 1 works in a saturated state is: $I=k(Vgs-Vth)^2=k(Vdata)^2$, therefore, the influence of Voled on the driving current I is eliminated, to the uniformity of display brightness of the display device is ensured. In addition, the influence of the negative power supply signal inputted by the negative power supply signal line VSS connected to the light-emitting element EL on the driving current I is also eliminated.

In some embodiments, the pixel driving circuit further includes a second reset sub-circuit 62, and the second reset sub-circuit 62 is connected to the reset signal line RE, the initialization signal line Init and the light-emitting element EL;

In the reset period P1, under the control of the reset signal line RE, the pixel driving circuit controls to connect the initialization signal line Init and the light-emitting element EL;

In the threshold compensation period P2, the data writing-in period P3 and the light-emitting period P4, under the control of the reset signal line RE, the pixel driving circuit controls to disconnect the initialization signal line Init from the light-emitting elements EL.

As shown in FIG. 7 and FIG. 8, in the reset period P1, under the control of the reset signal line RE, the second reset sub-circuit 62 controls to connect the initialization signal line Init and the anode of the light-emitting element EL, so as to realize the reset of the anode of the light-emitting element EL.

In some embodiments, the pixel driving circuit further includes a second control sub-circuit 72, the second control sub-circuit 72 is connected to the first gate line GA1, the initialization signal line Init and the second terminal of the first storage sub-circuit 21;

In the reset period P1, the data writing-in period P3 and the light-emitting period P4, under the control of the first gate line GA1, the second control sub-circuit 72 controls to disconnect the initialization signal line Init from the second terminal of the first storage sub-circuit 21;

In the threshold compensation period P2, under the control of the first gate line GA1, the second control sub-circuit 72 controls to connect the initialization signal line Init and the second terminal of the first storage sub-circuit 21.

As shown in FIG. 7 and FIG. 9, in the threshold compensation period P2, under the control of the first gate line GA1, the second control sub-circuit 72 controls to connect the initialization signal line Init and the second terminal of the first storage sub-circuit 21, the potential of the N2 node is written-in and maintained at Vinit.

In the data writing-in period P3, the change amount of the potential of the N2 node is Vdata−Vinit, and under the bootstrapping action of the first storage sub-circuit 21, the potential of the N1 node becomes Vinit+Vth+Vdata−Vinit, namely, Vth+Vdata.

When the pixel driving circuit includes the light-emitting control sub-circuit 8 and the second storage sub-circuit 22, in the light-emitting period P4, under the action of the second storage sub-circuit 22, the potential of the N1 node becomes Vth+Vdata+Voled−Vinit, Vgs=Vth+Vdata−Vinit. The driving current I is: $I=k(Vgs-Vth)^2=I=k(Vdata-Vinit)^2$, it can be known that the driving current I is related to the operation voltage Voled of the light-emitting element EL, is not related to the threshold voltage Vth corresponding to the driving sub-circuit 1, and the power supply voltage Vd.

The above-described pixel driving circuit further includes a second control sub-circuit 72, so that before the data writing-in period P3 starts, the N2 node has a stable potential, which is more conducive to the writing-in of the data signal.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant part can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It will be understood that when an element such as a layer, film, area or substrate is referred to as being "on" or "under" another element, it can be "directly on" or "under" the other element, or an intermediate element may be present.

In the foregoing description of the embodiments, the particular features, structures, materials or characteristics may be combined in any suitable manner in any one or more of the embodiments or examples.

The above are the preferred embodiments of the present disclosure. Obviously, a person skilled in the art may make further modifications and improvements without departing from the principle of the present disclosure, and these modifications and improvements shall also fall within the scope of the present disclosure.

What is claimed is:

1. A display device comprising a pixel driving circuit for driving a light-emitting element,
    wherein the pixel driving circuit comprises:
        a driving sub-circuit, wherein the driving sub-circuit is used to control to connect or disconnect a first terminal of the driving sub-circuit and a second terminal of the driving sub-circuit under the control of a control terminal of the driving sub-circuit, the second terminal of the driving sub-circuit is connected to the light-emitting element;

a first storage sub-circuit, wherein a first terminal of the first storage sub-circuit is connected to the control terminal of the driving sub-circuit;

a power control sub-circuit, respectively connected to a light-emitting control signal line, a first power line and the first terminal of the driving sub-circuit, and configured to control to connect or disconnect the first power line and the first terminal of the driving sub-circuit under the control of the light-emitting control signal line;

a compensation sub-circuit, respectively connected to a first gate line, the control terminal of the driving sub-circuit and the first terminal of the driving sub-circuit, and configured to control to connect or disconnect the control terminal of the driving sub-circuit and the first terminal of the driving sub-circuit;

a data writing-in sub-circuit, respectively connected to a second gate line, a data line and a second terminal of the first storage sub-circuit, and configured to control to connect or disconnect the data line and the second terminal of the first storage sub-circuit under the control of the second gate line;

a first reset sub-circuit, respectively connected to a reset signal line, the first power line and the control terminal of the driving sub-circuit, and configured to control to connect or disconnect the first power line and the control terminal of the driving sub-circuit under the control of the reset signal line;

a first control sub-circuit, respectively connected to the first gate line, an initialization signal line and the second terminal of the driving sub-circuit, and configured to control to connect or disconnect the initialization signal line and the second terminal of the driving sub-circuit under the control of the first gate line, wherein the display device comprises a plurality of the pixel driving circuits arranged in an array, and the plurality of the pixel driving circuits are divided into a plurality of rows of pixel driving circuits; the display device further comprises a gate driving circuit, a plurality of first gate lines, a plurality of second gate lines, a plurality of reset signal lines and a plurality of light-emitting control signal lines;

the gate driving circuit comprises a plurality of first shift register units corresponding to the plurality of rows of pixel driving circuits in a one-to-one manner;

the plurality of first gate lines are in one-to-one correspondence with the plurality of first shift register units and the plurality of rows of pixel driving circuits, and each pixel driving circuit comprised in each row of pixel driving circuits is connected to a corresponding first gate line, and the first gate line is connected to an output terminal of a corresponding shift register unit;

the plurality of second gate lines are in one-to-one correspondence with the plurality of rows of pixel driving circuits, each pixel driving circuit comprised in each row of pixel driving circuits is connected to a corresponding second gate line, and the second gate line corresponding to a current row of the pixel driving circuits is connected to an output terminal of a corresponding adjacent next shift register unit a first shift register unit corresponding to an adjacent next row of the pixel driving circuits;

the plurality of reset signal lines are in one-to-one correspondence with the plurality of rows of pixel driving circuits, and each pixel driving circuit comprised in each row of pixel driving circuits is connected to a corresponding reset signal line, a reset signal line corresponding to the current row of pixel driving circuits is connected to an output terminal of a corresponding previous shift register unit corresponding to an adjacent previous row of the pixel driving circuits;

a first gate line correspondingly connected to a current row of pixel driving circuit inputs a first scan signal, the first scan signal is multiplexed into a reset signal inputted by a reset signal line connected to an adjacent next row of pixel driving circuit; the first scan signal is multiplexed into a second scan signal inputted by a second gate line correspondingly connected to an adjacent previous row of pixel driving circuit, wherein the pixel driving circuit further comprises:

a second reset sub-circuit, the second reset sub-circuit is respectively connected to the reset signal line, the initialization signal line and the light-emitting element, and is configured to control to connect or disconnect the initialization signal line and the light-emitting element under the control of the reset signal line, a second control sub-circuit, respectively connected to the first gate line, the initialization signal line and the second terminal of the first storage sub-circuit, and configured to control to connect or disconnect the initialization signal line and the second terminal of the first storage sub-circuit under the control of the first gate line, wherein the second reset sub-circuit comprises a seventh transistor, a gate electrode of the seventh transistor is connected to the reset signal line, and a first electrode of the seventh transistor is connected to the initialization signal line, and a second electrode of the seventh transistor is connected to the light-emitting element, wherein the second control sub-circuit comprises a ninth transistor, a gate electrode of the ninth transistor is connected to the first gate line, and a first electrode of the ninth transistor is connected to the initialization signal line, and a second electrode of the ninth transistor is connected to the second terminal of the first storage sub-circuit.

2. The display device according to claim 1, wherein at least part of the first gate line, at least part of the second gate line, at least part of the reset signal line, and at least part of the light-emitting control signal line all extend along a same direction.

3. The display device according to claim 1, wherein each pixel driving circuit comprised in each row of pixel driving circuits is multiplexed as a first gate line corresponding to the row of pixel driving circuits, each pixel driving circuit comprised in each row of pixel driving circuits is multiplexed as a second gate line corresponding to the row of pixel driving circuits, each pixel driving circuit comprised in each row of pixel driving circuits is multiplexed as the reset signal line corresponding to the row of pixel driving circuits, and each pixel driving circuit comprised in each row of pixel driving circuits is multiplexed as the light-emitting control signal line corresponding to the row of the pixel driving circuits.

4. The display device according to claim 1, wherein each pixel driving circuit comprised in each row of pixel driving circuits is connected to a corresponding second gate line, and a signal transmitted by the second gate line corresponding to the row of pixel driving circuits is the same as a signal transmitted by the first gate line corresponding to an adjacent next row of pixel driving circuits.

5. The display device according to claim 1, wherein each pixel driving circuit comprised in each row of pixel driving circuits is connected to a corresponding reset signal line, and a signal transmitted by the reset signal line corresponding to the row of pixel driving circuits is the same as a signal transmitted by the first gate line corresponding to an adjacent previous row of pixel driving circuits.

6. The display device according to claim 1, wherein the pixel driving circuit further comprises a light-emitting control sub-circuit, and the second terminal of the driving sub-circuit is connected to the light-emitting element through the light-emitting control sub-circuit, the light-emitting control sub-circuit is respectively connected to the light-emitting control signal line, the second terminal of the driving sub-circuit and the light-emitting element, and configured to control to connect or disconnect the second terminal of the driving sub-circuit and the light-emitting element under the control of the light-emitting control signal line.

7. The display device according to claim 6, wherein the pixel driving circuit further comprises:

a second storage sub-circuit, a first terminal of the second storage sub-circuit is connected to the control terminal of the driving sub-circuit, and a second terminal of the second storage sub-circuit is connected to the light-emitting element.

8. The display device according to claim 6, wherein the light-emitting control sub-circuit comprises:

a sixth transistor, a gate electrode of the sixth transistor is connected to the light-emitting control signal line, and a first electrode of the sixth transistor is connected to the second terminal of the driving sub-circuit, and a second electrode of the sixth transistor is connected to the light-emitting element.

9. The display device according to claim 1, wherein, the driving sub-circuit comprises a third transistor;

the first storage sub-circuit comprises a first capacitor, a first terminal of the first capacitor is connected to a gate electrode of the third transistor;

the first reset sub-circuit comprises a first transistor, a gate electrode of the first transistor is connected to the reset signal line, and a first electrode of the first transistor is connected to the first power line, a second electrode of the first transistor is connected to the gate electrode of the third transistor;

the compensation sub-circuit comprises a second transistor, a gate electrode of the second transistor is connected to the first gate line, a first electrode of the second transistor is connected to a first electrode of the third transistor, and a second electrode of the second transistor is connected to the gate electrode of the third transistor;

the data writing-in sub-circuit comprises a fourth transistor, a gate electrode of the fourth transistor is connected to the second gate line, and a first electrode of the fourth transistor is connected to the data line, a second electrode of the fourth transistor is connected to the second terminal of the first capacitor;

the power control sub-circuit comprises a fifth transistor, a gate electrode of the fifth transistor is connected to the light-emitting control signal line, a first electrode of the fifth transistor is connected to the first power line, and a second electrode of the fifth transistor is connected to the first electrode of the third transistor;

the first control sub-circuit comprises an eighth transistor, a gate electrode of the eighth transistor is connected to the first gate line, and a first electrode of the eighth transistor is connected to the initialization signal line, and a second electrode of the eighth transistor is connected to the second terminal of the driving sub-circuit.

* * * * *